United States Patent
Kamata et al.

(10) Patent No.: US 12,071,709 B2
(45) Date of Patent: Aug. 27, 2024

(54) METHODS FOR MANUFACTURING SILICON CARBIDE SINGLE CRYSTAL INGOT AND SILICON CARBIDE SINGLE CRYSTAL WAFER

(71) Applicant: DENSO CORPORATION, Kariya (JP)

(72) Inventors: Isaho Kamata, Tokyo (JP); Hidekazu Tsuchida, Tokyo (JP); Norihiro Hoshino, Tokyo (JP); Yuichiro Tokuda, Kariya (JP); Takeshi Okamoto, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 18/362,117

(22) Filed: Jul. 31, 2023

(65) Prior Publication Data

US 2023/0374699 A1    Nov. 23, 2023

Related U.S. Application Data

(62) Division of application No. 17/027,840, filed on Sep. 22, 2020.

(30) Foreign Application Priority Data

Sep. 24, 2019   (JP) .................................. 2019-173463

(51) Int. Cl.
   *C30B 25/00*   (2006.01)
   *C30B 25/02*   (2006.01)
   (Continued)

(52) U.S. Cl.
   CPC .............. *C30B 29/36* (2013.01); *C30B 25/00* (2013.01); *C30B 25/02* (2013.01); *C30B 25/10* (2013.01); *C30B 33/00* (2013.01)

(58) Field of Classification Search
   None
   See application file for complete search history.

(56) References Cited

U.S. PATENT DOCUMENTS 3,147,159 A  *  9/1964  Lowe ...................... C30B 25/00
                                                      148/DIG. 148
4,780,174 A  * 10/1988  Lan ......................... C30B 25/12
                                                      117/103
(Continued)

FOREIGN PATENT DOCUMENTS

CN        108588817 A  *  9/2018  ........... C30B 23/066
DE          3915053 A  * 11/1990  ............. C30B 23/00
(Continued)

OTHER PUBLICATIONS

Ellison et al, HTCVD growth of semi-insulating 4H-SiC crystals with low defect density, 2000, MRS Online Proceedings Library, vol. 640, No. 12 (Year: 2000).*

(Continued)

*Primary Examiner* — Jeffrey A Vonch
(74) *Attorney, Agent, or Firm* — Posz Law Group, PLC

(57) ABSTRACT

A raw material gas is supplied to a space in which a silicon carbide seed crystal is placed. A silicon carbide single crystal is grown on the seed crystal by keeping a monosilane partial pressure at 4 kPa or more and heating the space to a temperature of 2400° C. to 2700° C. The temperature of the space and supply of the raw material gas are controlled such that a temperature gradient of a growth crystal surface of the silicon carbide single crystal in a radial direction is 0.1° C./mm or less, and a radius of curvature of the growth crystal surface is 4.5 m or more, thereby producing a silicon carbide single crystal ingot having a growth length of 3 mm or more and an internal stress of 10 MPa or less. The ingot is then cut into a silicon carbide single crystal wafer.

2 Claims, 9 Drawing Sheets

(51) Int. Cl.
   *C30B 25/10*   (2006.01)
   *C30B 29/36*   (2006.01)
   *C30B 33/00*   (2006.01)

(56) References Cited

U.S. PATENT DOCUMENTS

| | | | | |
|---|---|---|---|---|
| 4,866,005 A * | 9/1989 | Davis | ...................... | C30B 23/00 |
| | | | | 148/DIG. 21 |
| 5,471,946 A * | 12/1995 | Scholz | ............. | H01L 21/02529 |
| | | | | 117/90 |
| 6,565,822 B1 * | 5/2003 | Hoshi | ..................... | C30B 29/06 |
| | | | | 117/30 |
| 7,449,065 B1 * | 11/2008 | Powell | .................... | C30B 29/36 |
| | | | | 117/109 |
| 11,519,098 B2 | 12/2022 | Khlebnikov et al. | | |
| 2002/0038627 A1 * | 4/2002 | Vodakov | ................ | C01B 32/956 |
| | | | | 117/200 |
| 2002/0083885 A1 * | 7/2002 | Kuhn | ...................... | C30B 23/00 |
| | | | | 117/3 |
| 2003/0094132 A1 * | 5/2003 | Vodakov | ................ | C30B 29/36 |
| | | | | 117/200 |
| 2004/0194694 A1 * | 10/2004 | Sugiyama | ........... | C23C 16/4412 |
| | | | | 117/200 |
| 2005/0000406 A1 * | 1/2005 | Janzen | ................. | C30B 29/403 |
| | | | | 117/81 |
| 2005/0120944 A1 * | 6/2005 | Hong | ..................... | C30B 15/20 |
| | | | | 117/13 |
| 2005/0211156 A1 * | 9/2005 | Gunjishima | ............ | C30B 23/00 |
| | | | | 117/2 |
| 2006/0032434 A1 * | 2/2006 | Mueller | ................. | C30B 29/36 |
| | | | | 117/200 |
| 2006/0073707 A1 * | 4/2006 | Powell | .................... | C30B 23/00 |
| | | | | 438/745 |
| 2006/0075958 A1 * | 4/2006 | Powell | .................... | C30B 29/36 |
| | | | | 117/89 |
| 2006/0118037 A1 * | 6/2006 | Powell | .................... | C30B 23/00 |
| | | | | 117/105 |
| 2006/0130742 A1 * | 6/2006 | Carter | ................... | C30B 11/003 |
| | | | | 117/109 |
| 2006/0283389 A1 * | 12/2006 | Valente | .................. | C30B 29/36 |
| | | | | 118/715 |
| 2007/0068449 A1 * | 3/2007 | Seo | ......................... | C30B 23/00 |
| | | | | 117/84 |
| 2008/0067524 A1 * | 3/2008 | Basceri | ............. | H01L 21/02433 |
| | | | | 257/E29.345 |
| 2008/0237609 A1 * | 10/2008 | Powell | .................... | C30B 23/00 |
| | | | | 257/77 |
| 2009/0038538 A1 * | 2/2009 | Kaneko | .................. | C30B 19/04 |
| | | | | 117/54 |
| 2009/0169460 A1 * | 7/2009 | Song | ..................... | C30B 15/305 |
| | | | | 423/349 |
| 2010/0080956 A1 * | 4/2010 | Fujimoto | .............. | C30B 29/403 |
| | | | | 428/141 |
| 2010/0180814 A1 * | 7/2010 | Wu | ........................ | C30B 23/002 |
| | | | | 117/3 |
| 2010/0200866 A1 * | 8/2010 | Kitou | ..................... | C30B 29/36 |
| | | | | 257/77 |
| 2010/0289033 A1 * | 11/2010 | Ohtani | .................. | H01L 21/02378 |
| | | | | 257/77 |
| 2011/0006309 A1 * | 1/2011 | Momose | ........... | H01L 21/02378 |
| | | | | 257/77 |
| 2011/0290174 A1 * | 12/2011 | Leonard | .................. | C30B 29/36 |
| | | | | 117/84 |
| 2011/0308449 A1 * | 12/2011 | Katsuno | .................. | C30B 29/36 |
| | | | | 118/726 |
| 2012/0021173 A1 | 1/2012 | Shimada | | |
| 2012/0103249 A1 * | 5/2012 | Gupta | .................... | C30B 29/36 |
| | | | | 117/89 |
| 2012/0294790 A1 * | 11/2012 | Sasaki | .................. | C30B 23/025 |
| | | | | 428/137 |
| 2012/0308758 A1 | 12/2012 | Hori et al. | | |
| 2013/0280466 A1 * | 10/2013 | Zwieback | ................ | B28D 5/00 |
| | | | | 428/64.1 |
| 2014/0220296 A1 | 8/2014 | Loboda et al. | | |
| 2014/0220298 A1 | 8/2014 | Loboda | | |
| 2014/0234194 A1 * | 8/2014 | Zwieback | ............... | C30B 23/02 |
| | | | | 118/726 |
| 2014/0363607 A1 * | 12/2014 | Sato | ........................ | C30B 23/02 |
| | | | | 428/64.1 |
| 2015/0072101 A1 | 3/2015 | Drachev et al. | | |
| 2015/0128847 A1 * | 5/2015 | Danno | ..................... | C30B 9/10 |
| | | | | 117/67 |
| 2015/0167197 A1 * | 6/2015 | Ujihara | .................... | C30B 9/06 |
| | | | | 117/54 |
| 2016/0032486 A1 * | 2/2016 | Hansen | ................... | C30B 33/10 |
| | | | | 117/109 |
| 2016/0189956 A1 | 6/2016 | Hansen et al. | | |
| 2016/0215414 A1 * | 7/2016 | Nakabayashi | ...... | H01L 29/1608 |
| 2016/0230309 A1 * | 8/2016 | Danno | ..................... | C30B 19/04 |
| 2016/0233080 A1 | 8/2016 | Tanaka et al. | | |
| 2017/0275779 A1 * | 9/2017 | Nishiguchi | ............. | C30B 29/36 |
| 2017/0321345 A1 * | 11/2017 | Xu | .......................... | C30B 23/06 |
| 2017/0342593 A1 * | 11/2017 | Sato | ........................ | C30B 29/36 |
| 2018/0066380 A1 * | 3/2018 | Tani | ....................... | C30B 23/02 |
| 2018/0202070 A1 | 7/2018 | Asamizu | | |
| 2018/0298519 A1 * | 10/2018 | Shinya | ..................... | C30B 1/02 |
| 2019/0136409 A1 * | 5/2019 | Kaneko | ............ | H01L 21/02631 |
| 2019/0194822 A1 * | 6/2019 | Kindaichi | ............... | C30B 23/02 |
| 2021/0108334 A1 | 4/2021 | Kamata et al. | | |

FOREIGN PATENT DOCUMENTS

| | | | | |
|---|---|---|---|---|
| EP | 403887 A | * | 12/1990 | ............ C30B 23/00 |
| JP | 2004-002173 A | | 1/2004 | |
| JP | 2006-124247 A | | 5/2006 | |
| JP | 2009091222 A | * | 4/2009 | |
| JP | 2011219296 A | * | 11/2011 | |
| JP | 2012-240894 A | | 12/2012 | |
| JP | 2015-059072 A | | 3/2015 | |
| JP | 2015059072 A | * | 3/2015 | |
| JP | 2016044081 A | * | 4/2016 | |
| JP | 6235875 B2 | | 11/2017 | |
| JP | 2018186252 A | * | 11/2018 | |
| KR | 845946 B1 | * | 7/2008 | |
| WO | WO-0039372 A1 | * | 7/2000 | ............ C30B 23/00 |
| WO | WO-0127361 A1 | * | 4/2001 | ............ C30B 23/00 |
| WO | WO-2017090285 A1 | * | 6/2017 | ............ C30B 25/20 |
| WO | WO-2020077847 A1 | * | 4/2020 | ............ C30B 23/00 |

OTHER PUBLICATIONS

Hoshino et al., High-speed, high-quality crystal growth of 4H-SiC by high-temperature gas source method, May 2014, Applied Physics Express, vol. 7, No. 6 (Year: 2014).*

Tokuda et al., Stable and high-speed SiC bulk growth without dendrites by the HTCVD method, Aug. 2016, vol. 448, pp. 29-35 (Year: 2016).*

Hoshino et al., Fast growth of n-type 4H-SiC bulk crystal by gas-source method, Nov. 2017, Journal of Crystal Growth, vol. 478, pp. 9-16 (Year: 2017).*

Hoshino et al., Reduction in dislocation densities in 4H-SiC bulk crystal grown at high growth rate by high-temperature gas-source method, Aug. 2020, Applied Physics Express, vol. 13, No. 9 (Year: 2020).*

Zhang, J. et al. "Defect Reduction Paths in SiC Epitaxy", Mater. Res. Soc. Symp. Proc., Jan. 2014, pp. 7-18, vol. 1693.

Office Action mailed Aug. 17, 2023 in corresponding U.S. Appl. No. 17/027,840.

Final Office Action mailed Mar. 7, 2024 in corresponding U.S. Appl. No. 17/027,840.

Office Action mailed Jun. 13, 2024 in U.S. Appl. No. 18/161,228.

* cited by examiner

METHODS FOR MANUFACTURING SILICON CARBIDE SINGLE CRYSTAL INGOT AND SILICON CARBIDE SINGLE CRYSTAL WAFER

CROSS REFERENCE TO RELATED APPLICATIONS

This application is a divisional application of U.S. Utility application Ser. No. 17/027,840 filed on Sep. 22, 2020, which claims the benefit of priority from Japanese Patent Application No. 2019-173463 filed on Sep. 24, 2019, the entire disclosures of which are incorporated herein by reference.

TECHNICAL FIELD

The present disclosure relates to a silicon carbide single crystal wafer, a method for manufacturing a silicon carbide single crystal ingot, and a method for manufacturing a silicon carbide single crystal wafer.

BACKGROUND

Silicon carbide (hereinafter, also referred to as SiC) is a semiconductor having excellent physical properties such as a band gap of about 3 times of Si, a saturation drift rate of about 2 times of Si, and a dielectric breakdown electric field strength of about 10 times of Si, as well as having a large thermal conductivity. Therefore, the SiC is expected as a material for realizing a next generation high voltage and low conduction loss semiconductor device that greatly surpasses the performance of a currently used Si single crystal semiconductor.

SUMMARY

The present disclosure provides a silicon carbide single crystal water in which a dislocation density is 3500 dislocations/cm² or less, and a difference in the dislocation density among a wafer central part, a wafer peripheral part and a wafer intermediate part is less than 50% of an average value. The present disclosure further provides a method for manufacturing a silicon carbide single crystal ingot and a method for manufacturing a silicon carbide single crystal wafer.

BRIEF DESCRIPTION OF THE DRAWINGS

Objects, features and advantages of the present disclosure will become more apparent from the following detailed description made with reference to the accompanying drawings. In the drawings.

DETAILED DESCRIPTION

Figure 1:
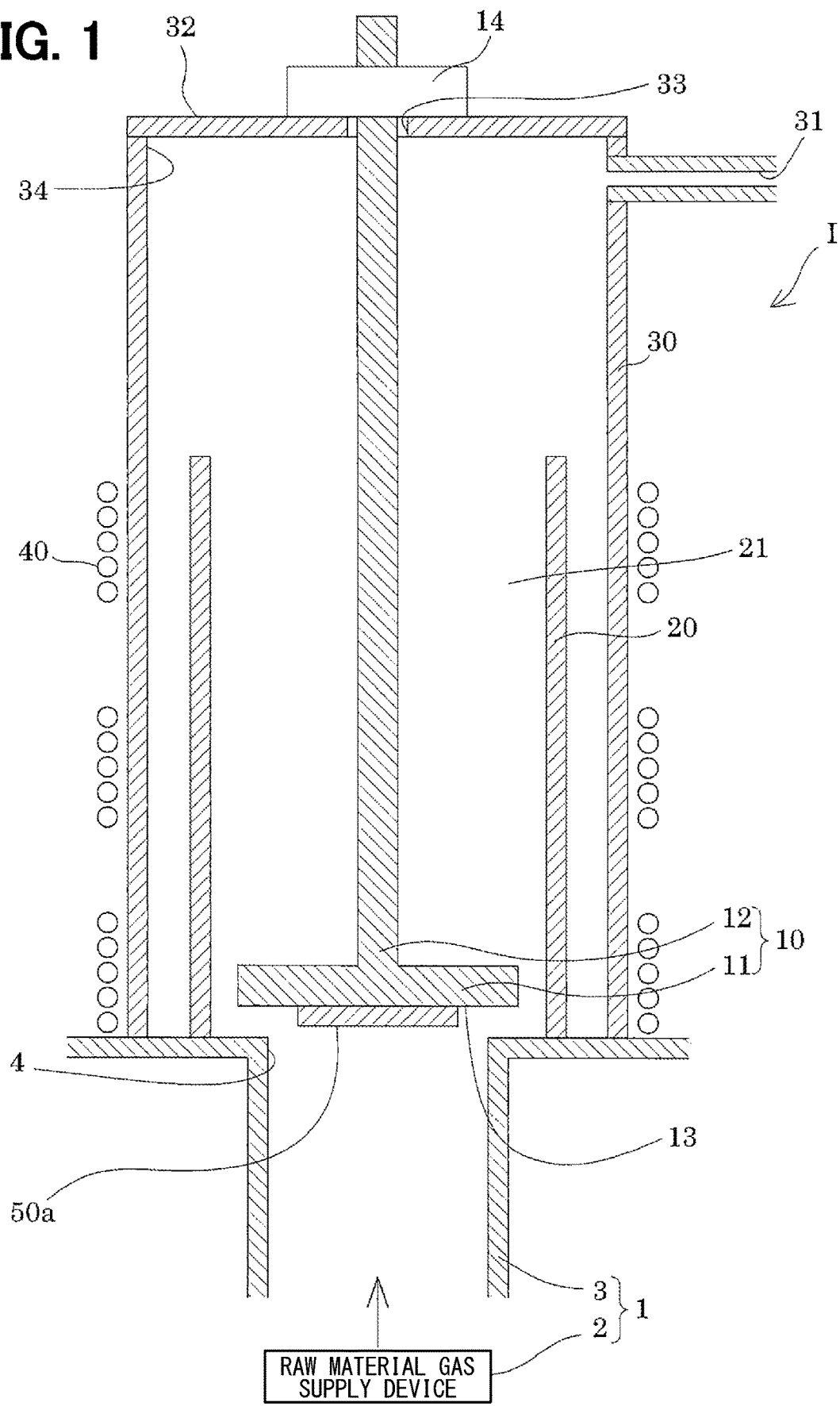
FIG. 1 is a cross-sectional view of a manufacturing apparatus for manufacturing a silicon carbide single crystal according to an embodiment.

A sublimation technique is used as one of techniques for producing a silicon carbide single crystal currently on the market.

Most of the silicon carbide single crystal wafers currently on the market are manufactured by the sublimation technique. However, the sublimation technique is conducted by setting a raw material and a seed crystal in a closed container. Therefore, the amount of silicon carbide bulk that can be produced in one growth is limited. As such, it is difficult to produce a long crystal cannot be formed due to the structural reason of the manufacturing method, so the manufacturing cost of the wafer produced from the bulk is high.

As another technique for producing a silicon carbide single crystal, a gas growth technique, such as a HTCVD technique, is known. In the gas growth technique, if the raw material gas is continuously supplied to the seed crystal, theoretically, an unlimitedly long SiC single crystal can be produced. If a long SiC single crystal can be grown t at high speed, it is possible to reduce the manufacturing cost.

Further, in a case where the surface (growth surface) of a seed crystal has a temperature gradient, for example, in which a peripheral part is high and a central part is low, the growth rate is not so high in the high temperature part but is high in the low temperature part. Therefore, there is a technique proposed to promote the growth by forming the surface shape of the seed crystal into a convex curved surface corresponding to an isothermal line.

A silicon carbide single crystal substrate is manufactured by the method as described above. However, the silicon carbide single crystal does not have a liquid phase under normal pressure and has an extremely high sublimation temperature. Therefore, it is difficult to conduct a high quality crystal growth, which does not cause crystal defects such as dislocations and stacking defects. For this reason, in regard to the silicon carbide single crystal, a technique for producing the single crystal having a large diameter without dislocations, as has been commercially available for a Si single crystal growth, has not been realized.

The dislocations inherent in a silicon carbide single crystal wafer propagate in an epitaxial film when the epitaxial film is grown on the wafer. As a result, a breakdown voltage and reliability of a semiconductor device formed by using the epitaxial film are likely to be reduced. As such, it is required a silicon carbide single crystal wafer having less dislocations or in which dislocations are evenly distributed even if being present.

The dislocations in a substrate wafer are propagated into the device. Therefore, if the device is produced using a silicon carbide water that is produced by a current manufacturing method and has uneven dislocation densities in the surface, the yield of the device is likely to be deteriorated depending on a region. Further, in a case where variations in the yield occurs in regions of the surface in the process of producing the device, if the current wafer is used, it is difficult to distinguish the cause due to the process or the wafer. As a result, it takes time to improve the process. Also, it is disadvantageous in terms of budget and time for investment.

According to a first aspect of the present disclosure, a silicon carbide single crystal wafer has a dislocation density of 3500 dislocations/cm² or less in the wafer, and has a difference in the dislocation density among a wafer central part, a wafer peripheral part and a wafer intermediate part being less than 50% of an average value.

When the silicon carbide single crystal water according to the first aspect is used, that is, when the silicon carbide single crystal wafer in which the dislocation density is 3500 dislocations/cm² or less and the difference of the dislocation density among the wafer central part, the wafer peripheral part and the water intermediate part is less than 50% is used, since the evenness of the dislocations in the surface is excellent, the yield improves in any regions during the manufacturing of the element. As such, it is possible to reduce the number of defective products.

In addition, there is no yield deterioration factor due to the wafer, it is possible to specify the cause due to the process when there is a defect. As such, it is possible to smoothly improve the process, and advantageous in terms of budget and time to invest.

According to a second aspect of the present disclosure, a silicon carbide single crystal wafer manufactured by a gas growth technique has an edge dislocation density of 3000 dislocations/cm² or less in the water, in which a difference in the edge dislocation density among a wafer central part, a wafer peripheral part, and a wafer intermediate part is less than 50% of an average value.

According to a third aspect of the present disclosure, a silicon carbide single crystal wafer manufactured by a gas growth technique has a screw dislocation density of 500 dislocations/cm² or less in the wafer, in which a difference of the screw dislocation density among a wafer central part, a wafer peripheral part and a wafer intermediate part is less than 50%.

According to a fourth aspect of the present disclosure, in the silicon carbide single crystal wafer of any of the first to third aspects, dislocations of the same type contained in the wafer are dispersed apart from each other with a constant distance of a distance of 150 micrometers (μm) or more.

The silicon carbide single crystal wafers according to the first to third aspects are high-quality silicon carbide single crystal wafers having few dislocations and in which existing dislocations are evenly distributed. These wafers can suppress degradations of the breakdown voltage and the reliability of a semiconductor device formed thereon using an epitaxial film.

Further, that the silicon carbide single crystal wafers according to the first to fourth aspects are single crystal wafers manufactured by a gas growth technique can be proved by that the content of Ta, Ti, and Nb in the crystal is $1\times10^{14}/cm^3$ or more. For example, a silicon carbide single crystal wafer manufactured by the sublimation technique does not contain Ta, Ti and Nb of $1\times10^{14}/cm^3$ or more.

According to a fifth aspect of the present disclosure, in a method for manufacturing a silicon carbide single crystal ingot, a silicon carbide single crystal is grown on a seed crystal made of silicon carbide by supplying a raw material gas containing hydrogen gas, monosilane, and hydrocarbon gas into a space in which the seed crystal placed, keeping a monosilane partial pressure to 4 kPa or more, and heating the space to a temperature of 2400° C. (degrees Celsius) to 2700° C. In particular, the temperature in the space and the supply of the raw material gas are controlled so that a growth crystal surface of the silicon carbide single crystal has a temperature gradient of 0.1° C./mm or less in a radial direction and a radius of curvature of 4.5 m or more. As a result of the controls, it is possible to obtain a silicon carbide single crystal ingot in which a growth length of a grown silicon carbide single crystal is 3 mm or more and an internal stress is 10 MPa or less.

According to a sixth aspect of the present disclosure, a method for manufacturing a silicon carbide single crystal wafer includes obtaining a silicon carbide single crystal ingot by the method for manufacturing a silicon carbide single crystal ingot according to the fifth aspect, and cutting the silicon carbide single crystal ingot into silicon carbide single crystal wafers.

According to the above, there are provided a method for manufacturing a high-quality silicon carbide single crystal wafer and a method for manufacturing a silicon carbide single crystal ingot, in which dislocations are few and existing dislocations are uniformly distributed.

Hereinafter, embodiments of the present disclosure will be described with reference to the drawings.

In an embodiment, a silicon carbide single crystal wafer is:
- a silicon carbide single crystal wafer that is manufactured by a gas growth method and in which a dislocation density contained in the wafer is 3500 dislocations/cm² or less, and a difference of dislocation density among a wafer central part, a wafer peripheral part and a wafer intermediate part is less than 50% of an average value;
- a silicon carbide single crystal wafer that is manufactured by a gas growth method and in which an edge dislocation density contained in the wafer, that is, an edge dislocation density evaluated by a method such as photoluminescence measurement or X-ray topography measurement is 3000 dislocations/cm² or less, and a difference of the edge dislocation density among a wafer central part, a wafer peripheral part, and a wafer intermediate part is less than 50% of an average value; or
- a silicon carbide single crystal wafer that is manufactured by a gas growth method and in which a screw dislocation density contained in the wafer, that is, a screw dislocation density evaluated by a method such as photoluminescence measurement or X-ray topography measurement is 500 dislocations/cm² or less and a difference of the screw dislocation density among a wafer central part, a wafer peripheral part and a water intermediate part is less than 50%.

Such a silicon carbide single crystal wafer is manufactured by a gas growth method, and has dislocations which are extremely low in density and uniformly distributed, as compared with a conventional silicon carbide single crystal wafer.

The dislocation density contained in the wafer can be evaluated by a KOH etch pit density contained in the wafer, that is, the etch pit density evaluated after a KOH etching treatment, or a dislocation contrast density contained in the wafer, that is, the dislocation contrast density evaluated by a method such as a photoluminescence measurement or an X-ray topography measurement.

Here, the KOH etch pit is the etch pit density evaluated by observation with an optical microscope after the KOH etching treatment, and corresponds to a total dislocation density.

The dislocation contrast density is evaluated by a method such as a photoluminescence measurement or an X-ray topography measurement, and corresponds to a total dislocation density. The X-ray topography can be evaluated using diffraction g=11-28 or equivalent diffraction g=1-128.

On the other hand, the edge dislocation density is the density of only edge dislocations, and the screw dislocation density is the density of only screw dislocations. The edge dislocation density and the screw dislocation density are evaluated by a method such as a photoluminescence measurement or an X-ray topography measurement.

A wafer manufactured by a gas growth method can be manufactured at a relatively low cost by one gas growth. On the other hand, a silicon carbide single crystal wafer manufactured by a sublimation method, which is currently on the market, contains several thousands of dislocations/cm$^2$ or more. If the wafer manufactured by the gas growth method is compared with the silicon carbide single crystal wafer manufactured by the sublimation method, the number of dislocations is small and the dislocations are uniformly distributed. In a single crystal wafer manufactured by an RAF technique of the sublimation method in which a crystal growth is repeated while rotating the orientation of a seed crystal by 90° to discharge the dislocations, the dislocations may be possibly reduced to the same extent as the wafer of the embodiment described above. However, the manufacturing costs for the wafer by the RAF technique are expected to be extremely high.

The gas growth method herein specifically means a gas growth method to grow a silicon carbide single crystal by supplying a raw material gas such as hydrogen gas, monosilane, and hydrocarbon gas into a space in which a seed crystal made of silicon carbide is placed.

Further, in order to grow a silicon carbide single crystal having a small dislocation density as described above by such a gas growth method, it is necessary to conduct the growth by devising a way to minimize the stress applied to the grown crystal. It is important to conduct precise control so that the stress in the grown crystal is 10 MPa or less by devising preferable growth conditions, such as a monosilane partial pressure being 4 kPa or higher, a heating temperature of 2400° C. to 2700° C., and controlling such that a temperature gradient of a grown crystal surface in the radial direction is 0.1° C./mm or less, and keeping the flatness of the grown crystal surface to have a radius of curvature of 4.5 m or higher.

Therefore, the silicon carbide single crystal wafer of the embodiment is manufactured by a silicon carbide single crystal manufacturing method in which a silicon carbide single crystal is grown on a seed crystal by conducting a precise control so as to suppress the pressure in the crystal to be 10 MPa or less, for example, by supplying a raw material gas such as hydrogen gas, monosilane, and a hydrocarbon gas to a space in which a seed crystal made of silicon carbide is placed, and by devising such as keeping a monosilane partial pressure to be 4 kPa or higher, heating to the temperature of 2400° C. to 2700° C., and controlling the temperature gradient of the grown crystal surface in the radial direction to be 0.1° C./mm or less, and keeping the flatness of the grown crystal surface to have the radius of curvature of 4.5 m or more.

The silicon carbide single crystal manufactured by the above method is formed as a columnar ingot. For example, in a case where the silicon carbide single crystal is grown from the seed crystal by 3 mm or more in a growth direction, the crystal dislocation density in the surface of the silicon carbide single crystal on the growth side of the silicon carbide single crystal ingot is 1/10 or less of the crystal dislocation density in the seed crystal.

In an embodiment, a silicon carbide single crystal wafer is manufactured by slicing from such a silicon carbide single crystal ingot and polishing.

A silicon carbide single crystal wafer of an embodiment is realized by discovering that the occurrence of dislocations is suppressed by reducing an internal pressure of the silicon carbide single crystal as much as possible by controlling the temperature gradient of the grown surface of a seed crystal extremely highly and uniformly and controlling the growth such that the growth surface has a flat surface shape as much as possible, as well as that the dislocations occurred in the crystal growth where the stress is reduced induces coalescence or pair annihilation due to mutual attractive force of the dislocations.

The high-quality silicon carbide single crystal wafer of an embodiment can suppress degradations of breakdown voltage and reliability of a semiconductor device formed thereon by using an epitaxial film.

Hereinafter, an example of manufacturing a high-quality silicon carbide single crystal wafer will be described as an embodiment.

First, an example of a silicon carbide single crystal wafer manufacturing apparatus will be described. FIG. 1 is a cross-sectional view of the manufacturing apparatus.

A manufacturing apparatus I is for bulk-growing a SiC single crystal by a high temperature gas growth technique. The manufacturing apparatus I includes a raw material gas supply unit 1 for supplying a raw material gas, a pedestal 10 for supporting a seed crystal made of SiC (hereinafter referred to as the first seed crystal 50a), a heat insulating container 20 for accommodating the pedestal 10 therein, a closed container 30 for accommodating the heat insulating container 20 therein and a coil 40 as a heating device for heating the inside of the heat insulating container 20.

The raw material gas supply unit 1 includes a raw material gas supply device 2 for silicon carbide and a pipeline 3 for defining a flow path of the raw material gas supplied from the raw material gas supply device 2. The pipeline 3 is provided with a supply port 4 on its upper surface in the vertical direction, and supplies the raw material gas from the raw material gas supply device 2 to the first seed crystal 50a.

The raw material gas is not particularly limited as long as SiC is precipitated on the first seed crystal 50a. For example, a raw material gas composed of $SiH_4$ or $C_3H_8$ gas and $H_2$ gas as a carrier gas can be used.

The pedestal 10 supports the first seed crystal 50a made of SiC. The pedestal 10 includes a columnar support portion 11 that supports the first seed crystal 50a, and a shaft portion 12 that is connected to the upper surface of the support portion 11 in the vertical direction. The support portion 11 has a support surface 13 on the lower surface thereof, which is a flat surface facing the supply port 4 of the pipeline 3 described above. In the pedestal 10, the first seed crystal 50a is adhered to the support surface 13. The material of the support portion 11 is not particularly limited, but may be formed of graphite or silicon carbide.

The pedestal 10 can be moved up and down in the vertical direction by the moving mechanism 14. That is, the movement mechanism 14 moves the shaft portion 12 up and down so that the entire pedestal 10 moves up and down. The raw material gas is supplied from the supply port 4 to the first seed crystal 50a adhered to the support surface 13. Therefore, the first seed crystal 50a grows by being supplied with the raw material gas while being moved upward by the pedestal 10.

It is not always necessary that the pedestal 10 is movable in the vertical direction. The pedestal 10 may be fixedly arranged in the closed container 30.

The heat insulating container 20 is a container that accommodates the pedestal 10 therein, and is formed of a heat insulating material. The heat insulating material is not particularly limited, but may be provided, for example, by alumina, zirconia, pyrolytic carbon, graphite, or the like.

The heat insulating container 20 has a cylindrical shape and provides an internal space 21 therein. The heat insulating container 20 is placed on the opening edge of the supply port 4 of the pipeline 3, and the internal space 21 is in communication with the pipeline 3 via the supply port 4.

The pedestal 10 is accommodated in the internal space 21 of the heat insulating container 20. The shaft portion 12 of the pedestal 10 is inserted into an insertion hole 33 of a lid 32 formed on the upper surface of the closed container 30. Since the pedestal 10 can be moved up and down as described above, the support portion 11 can be moved up and down in the internal space 21.

The closed container 30 is a container that accommodates the heat insulating container 20 therein. The material of the closed container 30 is not particularly limited, but may be provided, for example, by quartz, metal, or the like. Further, the closed container 30 is provided with a discharge path 31, so that the raw material gas supplied from the supply port 4 is discharged through the discharge path 31.

Further, the closed container 30 has the lid covering an opening 34 formed at the upper portion thereof. The lid 32 can be formed from the same material as the closed container 30. During the manufacturing of a SiC single crystal, the closed container 30 is air-tightly sealed by the lid 32. On the other hand, during works such as removal of the grown SiC single crystal, installation of a new seed crystal, and maintenance, the lid 32 is opened to allow such works.

The heating device heats the inside of the heat insulating container 20. The temperature inside the heat insulating container 20 is set by the heating device. Specifically, the coil 40 can be used as the heating device.

The coil 40 performs induction heating relative to the heat insulating container 20. Although not particularly shown, the coil 40 is connected to an alternating current power source to be supplied with a high-frequency alternating current. The coil 40 is used as a main heat source for raising the temperature inside the heat insulating container 20 to a high temperature of, for example, 1500° C. or higher. Although not particularly shown, in a case where a closed container 30 made of metal is used, the coil 40 is arranged inside the closed container 30 and outside the heat insulating container 20.

Further, although not particularly shown, the support portion 11 of the pedestal 10 is provided with a cooling mechanism to dissipate heat of the first seed crystal 50a.

In the SiC single crystal manufacturing apparatus I having the above-described configuration, the inside of the heat insulating container 20 is set to a high temperature by the coil 40. On the other hand, the first seed crystal 50a is set to a relatively low temperature by the cooling mechanism of the pedestal 10. By supplying the raw material gas to the first seed crystal 50a, a SiC single crystal grows on the first seed crystal 50a. At this time, the first seed crystal 50a grows while being pulled upwardly by the pedestal 10.

In an embodiment, the material and shape of the heat insulating container 20, the material and shape of the closed container 30, the shape and arrangement of the coil 40, the arrangement of the cooling mechanism and the like are devised so that a temperature gradient on a surface that is along the surface of the seed crystal 50a parallel to the support surface 13 of the support portion 11 of the pedestal 10 in a radial direction from the center to an outer end is set as small as possible. The stress in the growth crystal decreases with the decrease in the temperature gradient. In order to realize the silicon carbide single crystal wafer of the embodiment, the internal stress needs to be 10 MPa or less. In order to grow such a crystal in which the internal stress is reduced, it is found that the temperature gradient in the radial direction needs to be 0.15° C./mm or less, preferably, to 0.1° C./mm or less from an experiment described later.

Further, in addition to make the temperature gradient uniform, the supply of the raw material gas containing SiC from the raw material gas supply device 2 into the closed container 30 is devised, so that the growth surface of the SiC single crystal 51 growing on the seed crystal 50a is made as flat as possible, and that the stress in the SiC single crystal 51 is reduced as much as possible.

In order to realize a silicon carbide single crystal wafer as an embodiment, the internal stress needs to be 10 MPa or less. In order to grow a crystal in which such internal stress is reduced, it is known, from an experiment described later, that it is better to conduct the crystal growth so that the radius of curvature of the curve corresponding to the radius of the growth surface is 4000 mm or more, preferably 4500 mm or more, and more preferably 5000 mm or more.

Figure 2:
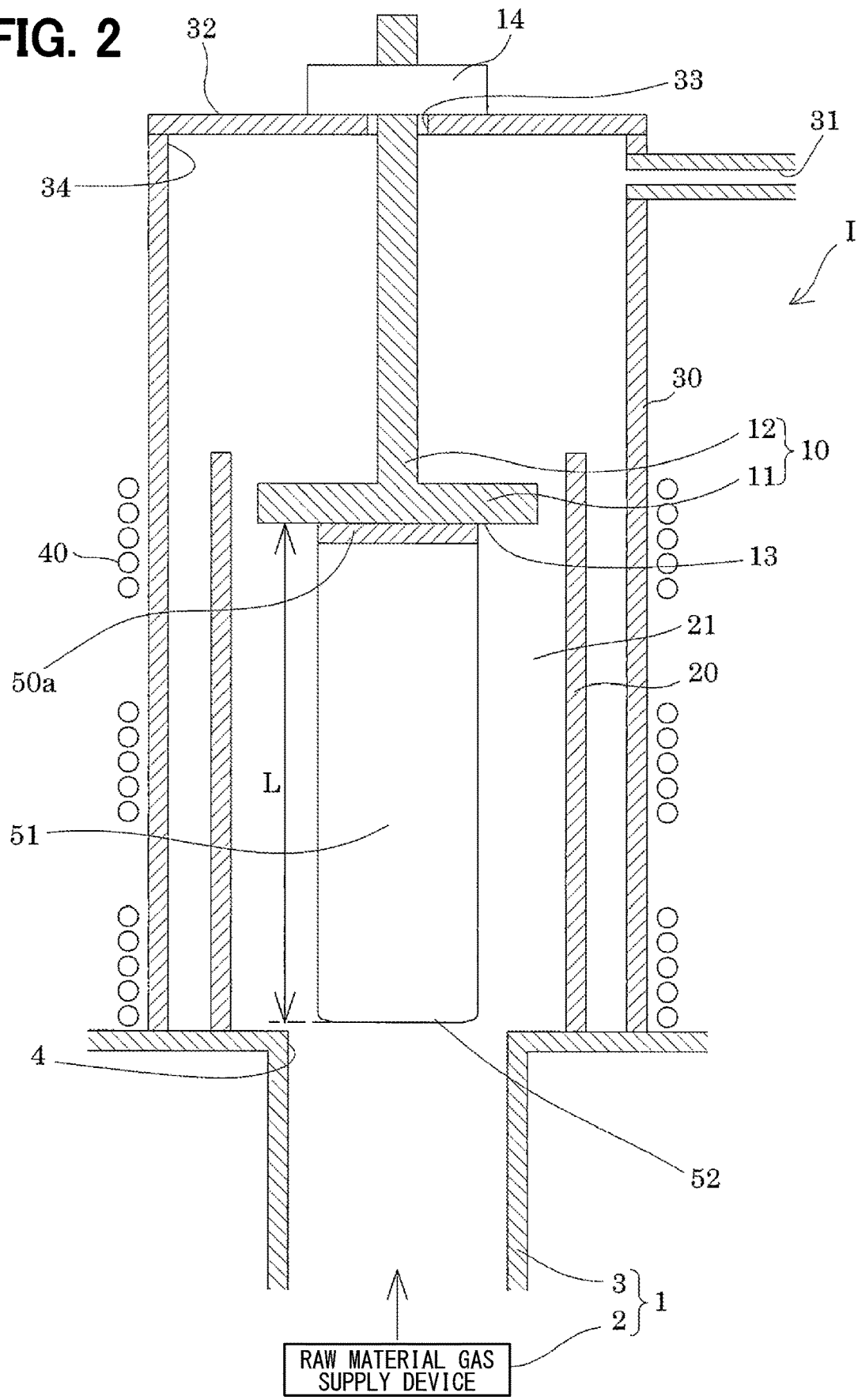
FIG. 2 is a cross-sectional view of the manufacturing apparatus for showing a process for manufacturing the silicon carbide single crystal according to the embodiment.

Next, a method for manufacturing a SiC single crystal of an embodiment performed by the above-mentioned manufacturing apparatus I will be described with reference to FIG. 2.

First, a SiC single crystal 51 is grown on a first seed crystal 50a. Specifically, a raw material gas containing SiC is supplied from a raw material gas supply device 2 toward a first seed crystal 50a in a closed container 30. When the crystal is grown from the surface of the first seed crystal 50a to a certain length, the shape of the growth surface 52 becomes a flat surface shape, and the entire growth surface 52 grows as a crystal. Then, the SiC single crystal 51 grows up to the length L while maintaining the shape of the growth surface 52. The length L herein is the maximum length of the SiC single crystal 51 that can be manufactured by the manufacturing apparatus I.

Further, in a growth step of an embodiment, a crystal growth of a SiC single crystal 51 is performed while pulling the support portion 11 upward (in the direction opposite to the raw material gas supply port 4) by the moving mechanism 14. The support portion 11 is pulled up at the same rate (substantially the same rate) as the growth rate of the SiC single crystal 51. Therefore, the relative position of the surface (growth surface 52) of the SiC single crystal 51 with respect to the supply port 4 is always constant.

For example, the moving mechanism 14 is used to position the surface of the first seed crystal 50a in the vicinity of the supply port 4 (see FIG. 1). Thereafter, the SiC single crystal 51 grows as a crystal. At this time, the support portion 11 is pulled upward according to the growth rate of the SiC single crystal 51. Therefore, as shown in FIG. 2, the growth surface 52 of the SiC single crystal 51 is at the same position as the vicinity of the supply port 4 where the surface of the first seed crystal 50a was initially located. That is, the growth surface 52 does not protrude from the supply port 4 into the pipeline 3.

Figure 3A:
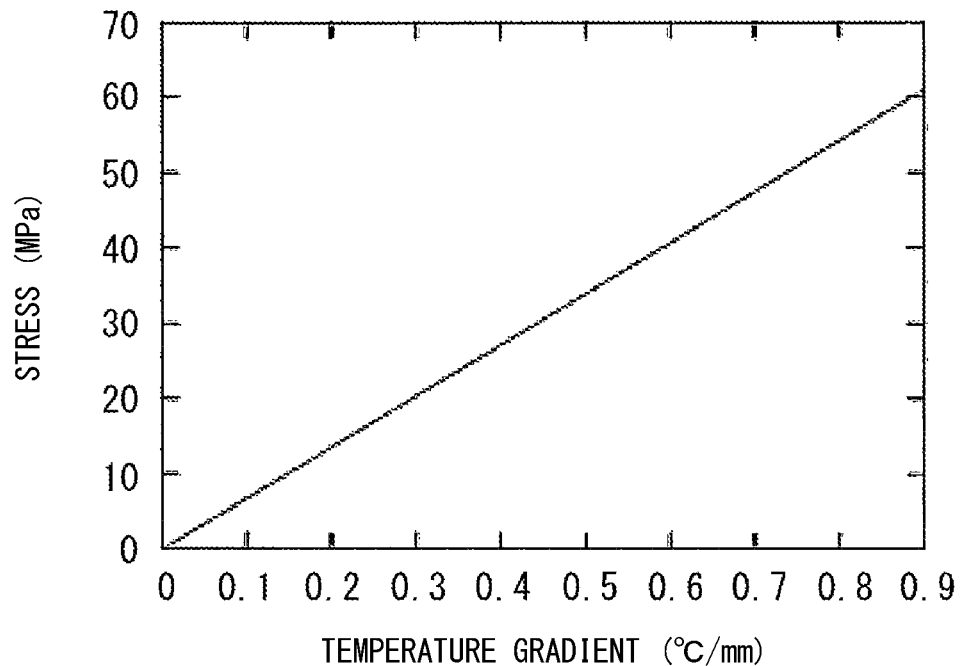
FIG. 3A is a graph showing a relationship between an internal stress and a temperature gradient in a radial direction of a SiC single crystal.
Figure 3B:
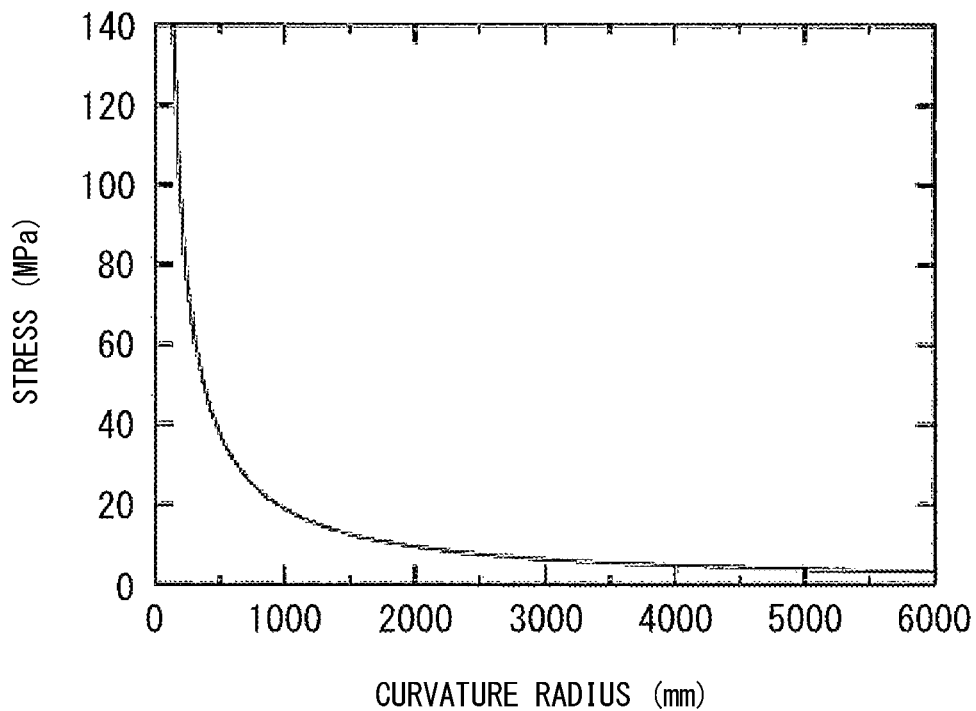
FIG. 3B is a graph showing a relationship between the internal stress and a radius of curvature defined by the shape of a grown crystal surface.

FIG. 3A and FIG. 3B, respectively, show a relationship between an internal stress of the SiC single crystal 51 and a temperature gradient in a radial direction, and a relationship between the internal stress of the SiC single crystal 51 and a radius of curvature of the shape of the grown crystal surface, when the SiC single crystal 51 is grown while changing the temperature gradient and the raw material gas supply.

As shown in FIG. 3A, it is found that the temperature gradient and the internal stress are almost proportional, and the internal stress decreases with the decrease in temperature gradient. Further, it is found that the temperature gradient in the radial direction needs to be 0.15° C./mm or less, preferably 0.1° C./mm or less, in order to make the internal stress 10 MPa or less.

Further, as shown in FIG. 3B, it is found that the internal stress reduces with the increase in radius of curvature of the curve corresponding the radius, that is, with the grown crystal surface being closer to a flat surface shape, and that it is preferable to grow the crystal such that the radius of curvature of the curve corresponding to the radius of the growth surface is 4000 mm or more, preferably 4500 mm or more, and more preferably 5000 mm or more, in order to make the internal stress at least 10 MPa or less.

If the internal stress is significantly high, the grown crystal may not be able to withstand the stress and will cause cracks. For example, it is known from calculations and experiments that cracks occur in the grown crystal when the internal stress becomes 30 MPa or more.

A silicon carbide single crystal wafer of an embodiment can be realized by combining these conditions.

As described above, it is confirmed as follows that the number of dislocations is small and distribution of the dislocations is uniform when a produced SiC single crystal 51 has an internal stress of 10 MPa or less.

Dislocations include threading screw dislocations (TSDs), threading edge dislocations (TEDs), threading mixed dislocations (TMDs), and basal plane dislocation (BPDs). The TDSs include two types of dislocations, and TEDs include six types of dislocations, the TMDs include twelve types of dislocations, and the BPDs include six types of dislocations. When the direction of dislocation shift is simply defined, the TSDs include two types of dislocations, one being in a plus direction and the other being in a minus direction. Crystallographically, the directions are defined as +c and −c according to the Burgers vector. In this specification, the directions are simply defined as the plus direction and the minus direction. An attractive force acts between the TSD of the plus direction and the TSD of the minus direction, and a repulsive force acts between the TSDs of the same direction. Similarly to the TSDs, the TMDs include some having a component in a plus direction and a component in a minus direction along a c-axis direction. Similarly, the attractive force acts between the TMD of the plus direction and the TMD of the minus direction, and the repulsive force acts between the TMSs of the same direction.

When the dislocations of the SiC single crystal 51 in which the stress is reduced as described above are observed, the followings are confirmed in regard to the through dislocations.

Figure 4A:
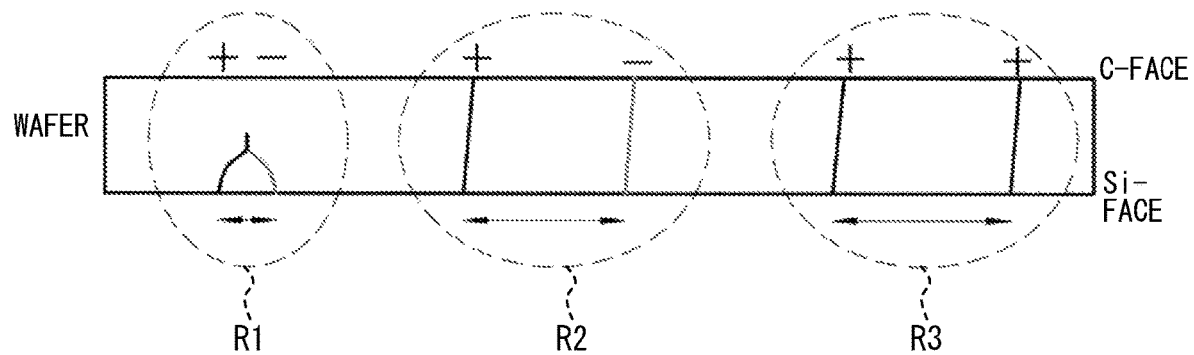
FIGS. 4A and 4B are diagrams for explaining the interaction of dislocations.

As shown in FIG. 4A, when the TSDs having different signs of the directions are located close to each other, they interact with each other and annihilate (see R1). On the contrary, when the TSDs having the different signs of the directions are located apart from each other to some extent, they hardly interact with each other (See R2). Further, when the TSDs having the same sign of the directions are located close to each other, they repel each other and are separated from each other (see R3). Although these actions have been described in regard to the TSDs, similar actions occur between the TSDs and the TMDs and between the TMDs.

The same applies to other dislocations. When the SiC single crystal 51 to which the stress is reduced is grown, the dislocations at close distances interact with each other according to the signs of the dislocations. The dislocations having the opposite signs annihilate due to the attractive force, and the dislocations having the same sign disperse due to the repulsive force. Therefore, it is found that, after a certain growth time, dislocations reduce immediately after the growth and are in a dispersed state.

Figure 4B:
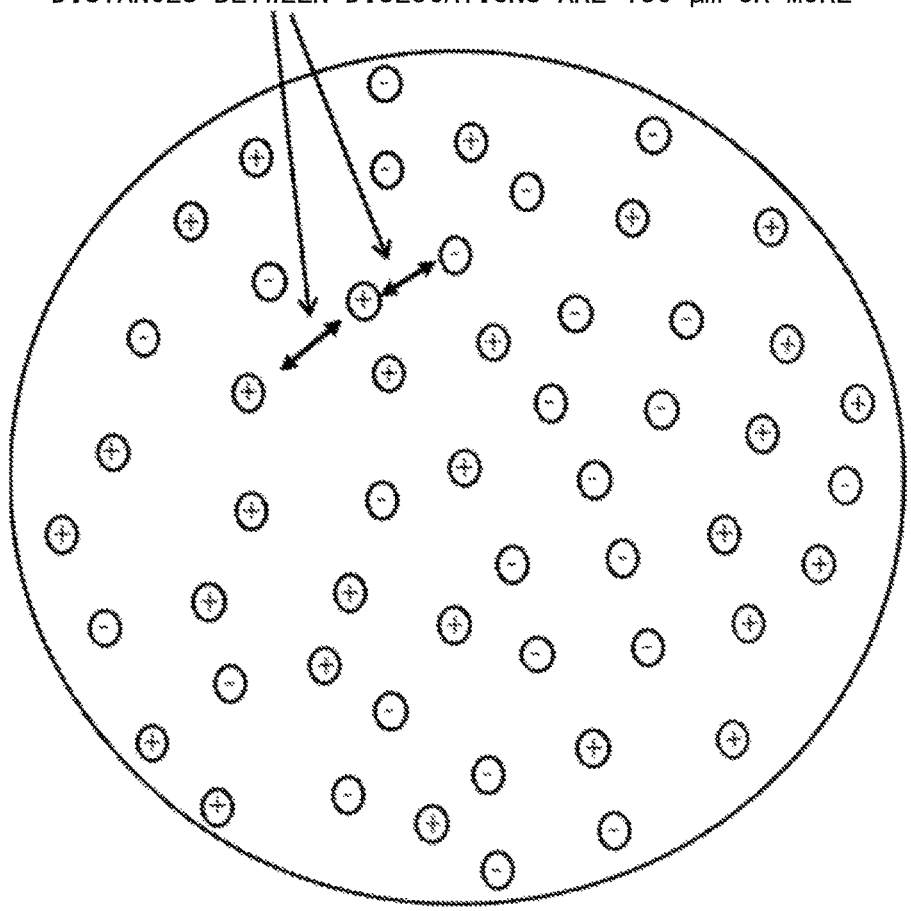

In the state where the crystal growth has not progressed sufficiently, the dislocations move due to repulsive force or attractive force and the dislocations are not dispersed. However, after the crystal growth has progressed sufficiently, the distances between dislocations are dispersed due to annihilation and coalescence of the dislocations and repetition of repulsion of the dislocations. When the dislocation density is about 3500 dislocations/cm$^2$ (35 dislocations/mm$^2$), the distance between the dislocations is estimated to be about 167 μm. Therefore, even if the fluctuation of the position of each dislocation is taken into consideration, the distance between dislocations is estimated to be about 150 μm. FIG. 4B shows a conceptual diagram of dislocations dispersed in a wafer. The dislocations repeat annihilation, coalescence and repulsion as shown in FIG. 4A, and thus FIG. 4B shows a state where the dislocations having plus and minus signs are uniformly dispersed in a wafer surface with distances therebetween of 150 μm or more. Further, the distribution of dislocations is similar among a wafer central part, a wafer peripheral part and a wafer intermediate part, and there is no bias in the distribution of dislocations among the wafer central part, the wafer peripheral par and the wafer intermediate part. However, since there is no interaction between different kinds of dislocations, such as between the TSDs and the TEDs or the BPDs, it is necessary to define the degree of dispersion of the dislocation distance between the same kinds of dislocations. Furthermore, in regions where large crystal defects such as small grain boundaries, voids, inclusions, or micropipes are present, since a local stress is applied, the above-described dislocation-to-dislocation interaction does not work sufficiently. Therefore, the dispersion of dislocations has not been achieved. However, such a region having the large defects is not originally an effective region of the wafer because the negative influence of the large defect is large when a device or the like is formed. Therefore, it is considered that there is no problem in excluding the region around the large defects from the region that needs to define the dispersion.

The dislocation density of the silicon carbide single crystal wafer of an embodiment is firstly defined by the etch pit density total dislocation density) that is evaluated after the KOH etching treatment. The etch pit density of the wafer is 3500 dislocations/cm$^2$ or less, more preferably 1750 dislocations/cm$^2$ or less, and the difference of the etch pit density is less than 50% of an average value, in the comparison between a wafer central part, a wafer peripheral part and a wafer intermediate part.

Figure 5:
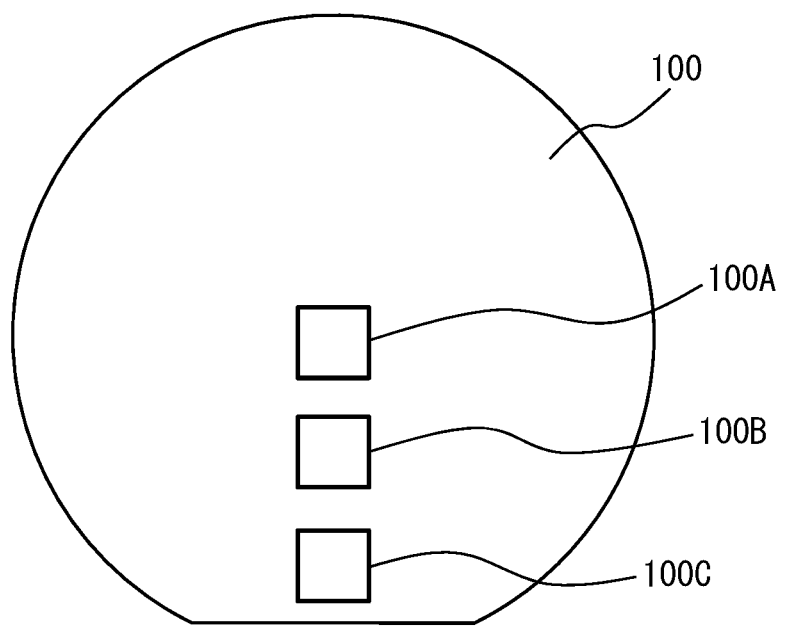
FIG. 5 is a diagram showing locational images of a wafer central part, a wafer intermediate part and a wafer peripheral part.

FIG. 5 shows the image of the locations, that is, the wafer central part, the wafer intermediate part and the water peripheral part. In a wafer 100, 100A denotes the wafer central part, 100B denotes the wafer intermediate part, and 100C denotes the wafer peripheral part.

The dislocation density of the silicon carbide single crystal wafer of an embodiment is secondly defined by a dislocation contrast density total dislocation density) that is evaluated by a method such as photoluminescence measurement or X-ray topography measurement. The dislocation contrast density of the wafer is 3500 dislocations/cm$^2$ or less, more preferably 1750 dislocations/cm$^2$ or less, and the difference of the etch pit density is less than 50% of the average value, in the comparison between the wafer central part, the wafer peripheral part and the wafer intermediate part.

The dislocation density of the silicon carbide single crystal wafer of an embodiment is thirdly defined by an edge dislocation density contained in the wafer. The edge dislocation density is measured by a method such as photoluminescence measurement or X-ray topography measurement, for example. In the wafer of an embodiment, the edge dislocation density is 3000 dislocations/cm$^2$ or less, more preferably 1500 dislocations/cm$^2$ or less, and the difference of the edge dislocation density is less than 50% of the average value in the comparison between the wafer central part, the wafer peripheral part and the wafer intermediate part.

The dislocation density of the silicon carbide single crystal wafer of an embodiment is fourthly defined by a screw dislocation density contained in the wafer. The screw dislocation density is measured by a method such as photoluminescence measurement or X-ray topography measurement, for example. In the wafer of an embodiment, the screw dislocation density is 500 dislocations/cm$^2$ or less, more preferably 250 dislocations/cm$^2$ or less, and the difference of the edge dislocation density is less than 50% of the average value in the comparison between the wafer central part, the wafer peripheral part and the wafer intermediate part.

In order to fabricate the device, various processing will be added on the wafer described above. The processing includes various steps as described hereinafter. (1) A step of forming a drift layer in which the concentration of n-type impurities is controlled to be low and a layer in which p-type impurities are controlled and mixed, by an epitaxial growth using a chemical vapor phase growth apparatus. (2) A step of injecting impurity ions. (3) A step of performing a heat treatment at a high temperature of 2000° C. or higher in order to activate the injected ions. (4) A step of forming an oxide film to form an insulating film. A step of applying a resist and etching to leave only necessary portions and remove unnecessary portions. A step of depositing a metal to form an electrode. A semiconductor device is produced by sequentially performing these steps. During the development of the device, defects may occur in the characteristics of the manufactured devices, and the probability of occurrence of defective products is called the yield, which affects the costs of the products.

Since dislocations in a substrate wafer are propagated into the device, if the device is formed by using a silicon carbide wafer that is manufactured by the current manufacturing method and has unevenness in the dislocation density in the plane, it is one of issues that the yield of the device is worsened depending on regions. When the silicon carbide single crystal wafer of the embodiment, that is, the wafer in which the dislocation density contained therein is 3500 dislocations/cm$^2$ or less, and, as the dislocation density distribution, the difference of the dislocation density among the wafer central part, the wafer peripheral part and the wafer intermediate part is less than 50% of the average value is used, the evenness in the in-plane direction is favorable. Therefore, in the production of the devices, the yield improve in any regions, and the defective products can be reduced. As such, the issue described above can be avoided.

In a case where the yield is partially deteriorated in the in-plane direction of the wafer, it is necessary to determine the process by identifying and improving the cause. In such a case, if a defect occurs in a certain region of the wafer, it is necessary to repeat trial and error experiments to determine in which step of the process the defect occurred, identify and improve the causative process. However, if it is not possible to distinguish whether the defect in a certain region of the wafer is due to the process or the dislocation distribution of the wafer, it takes a lot of effort to improve the process, and a huge amount of energy is required in terms of human, time, and material, resulting in a big issue.

On the other hand, if the wafer of the embodiment is used, since there is no partial deterioration factor in the yield due to the wafer, it is possible to specify the cause to the process factor when a defect occurs. As such, the process improvement can be performed quickly, and hence there are advantageous in terms of budget and time to invest, and thus the issue can be avoided.

Example 1

Figure 6A:
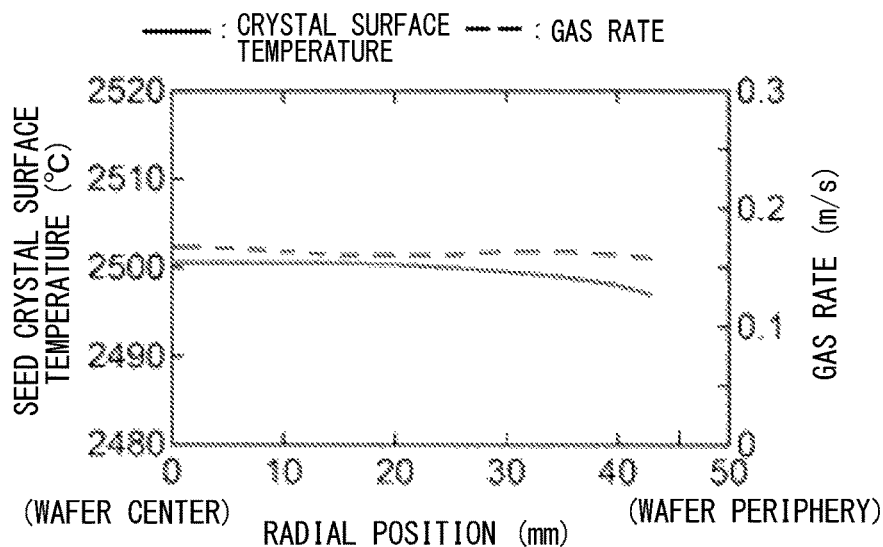
FIGS. 6A, 6B, and 6C are diagrams for explaining a silicon carbide single crystal of Example 1.
Figure 6B:
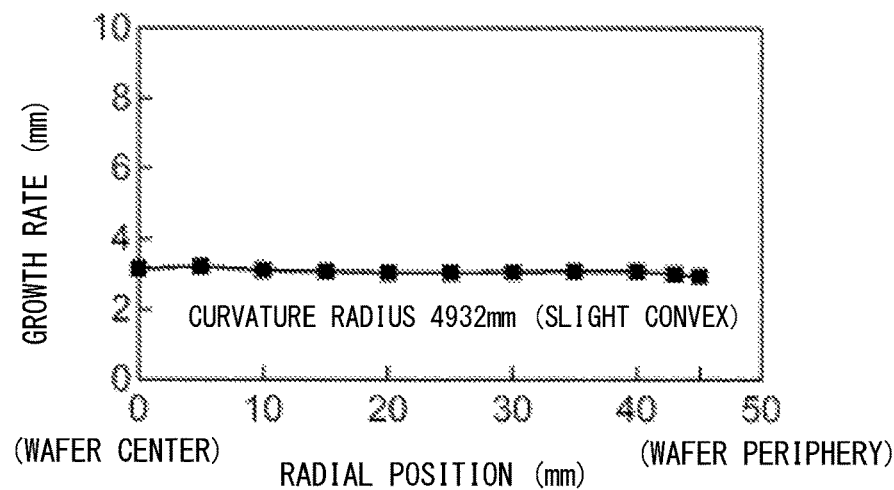

When a SiC single crystal 51 was grown at a seed crystal surface temperature (temperature gradient of about 0.06° C./mm) and a raw material gas flow rate as shown in FIG. 6A, the SiC single crystal with the surface having the radius of curvature of 4932 mm and being slightly convex upwardly (slight convex) as shown in FIG. 6B was obtained. The internal stress of the single crystal is estimated to be 10 MPa or less from FIG. 3A and FIG. 3B. A radial position corresponds to a distance position from the center of the wafer, as zero position, in a direction toward the peripheral end of the wafer.

Figure 6C:
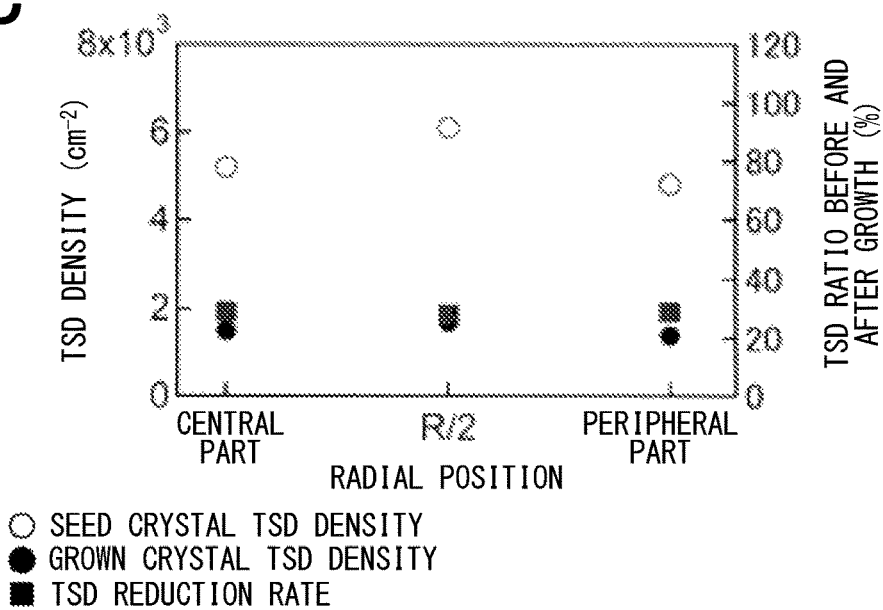

The TSD densities at the central part, the peripheral part and the intermediate part (½ position of the radius R) of the SiC single crystal were measured. The results are shown in FIG. 6C.

As a result, it was found that the TSD densities were 2000 dislocations/cm$^2$ or less, and were substantially the same at any parts of the wafer, and reduced to about 30% of 5000 dislocations/cm$^2$ to 6000 dislocations/cm$^2$ of the seed crystal, and thus the distribution was uniform.

Comparative Example

Figure 7A:
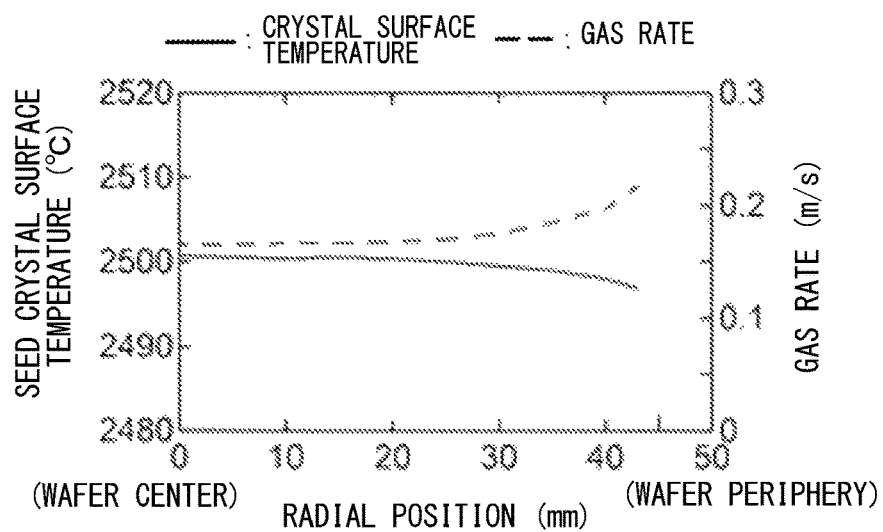
FIGS. 7A, 7B, and 7C are diagrams for explaining a silicon carbide single crystal of a comparative example.
Figure 7B:
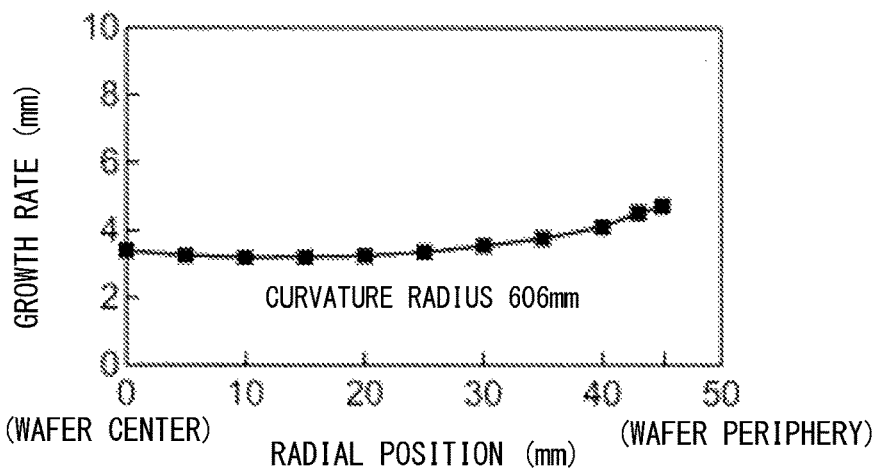

When a SiC single crystal 51 was grown at the seed crystal surface temperature (temperature gradient of about 0.08° C./mm) and the raw material gas flow rate as shown in FIG. 7A, the SiC single crystal with the surface having the radius of curvature of 606 mm and being the downwardly convex surface (concave surface) as shown in FIG. 7B was obtained. The internal stress of the single crystal is estimated to be about 30 MPa from FIG. 3A and FIG. 3B.

Figure 7C:
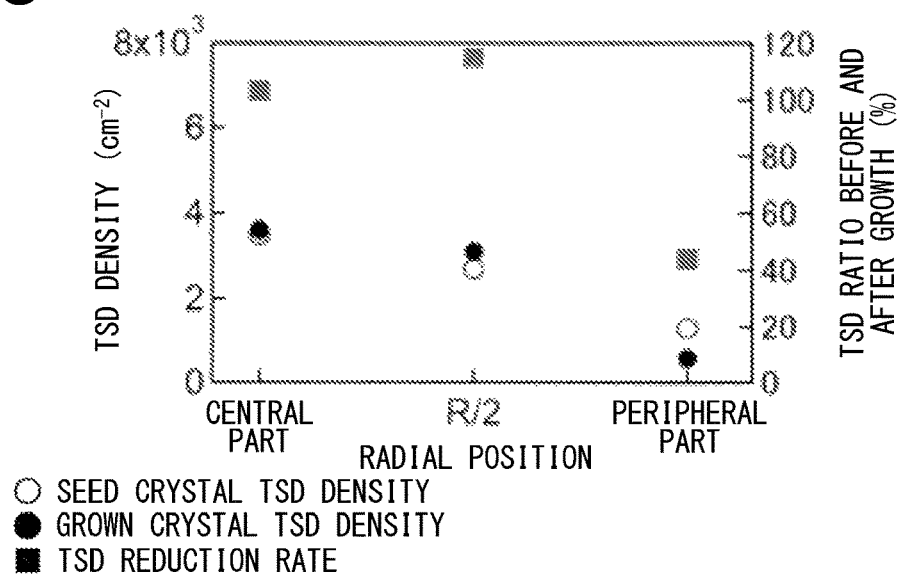

The TSD densities at the central part, the peripheral part, and the intermediate part (½ position of the radius R) of the SiC single crystal were measured. The results are shown in FIG. 7C.

As a result, the TSD density at the peripheral part was reduced to about 40%. However, the TSD densities at the central part and the intermediate part (½ position of the radius R) were equal to or slightly increased from those of the seed crystal, and the decrease in number and the evenness of distribution were not found.

Example 2

Figure 8A:
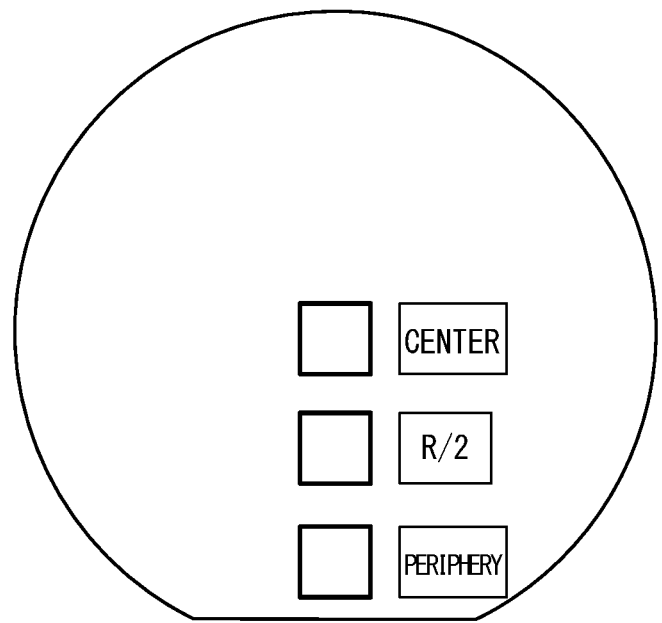
FIGS. 8A, 8B, 8C, and 8D are diagrams for explaining a silicon carbide single crystal of Example 2.
Figure 8B:
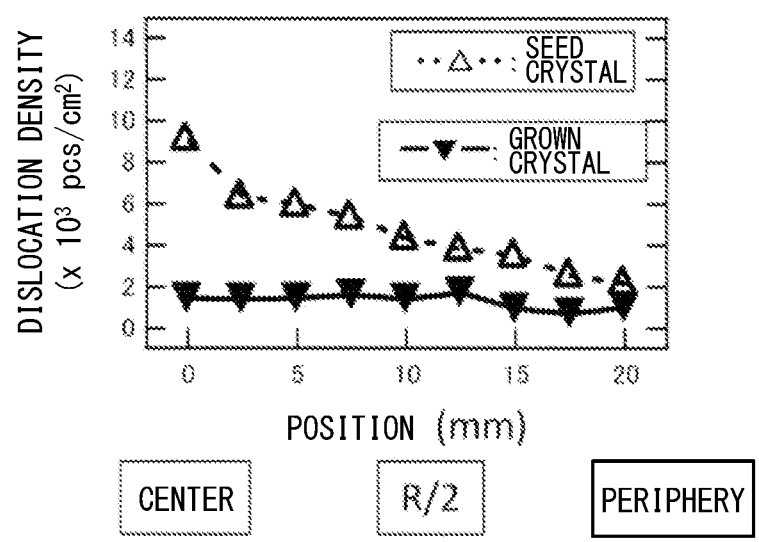
Figure 8C:
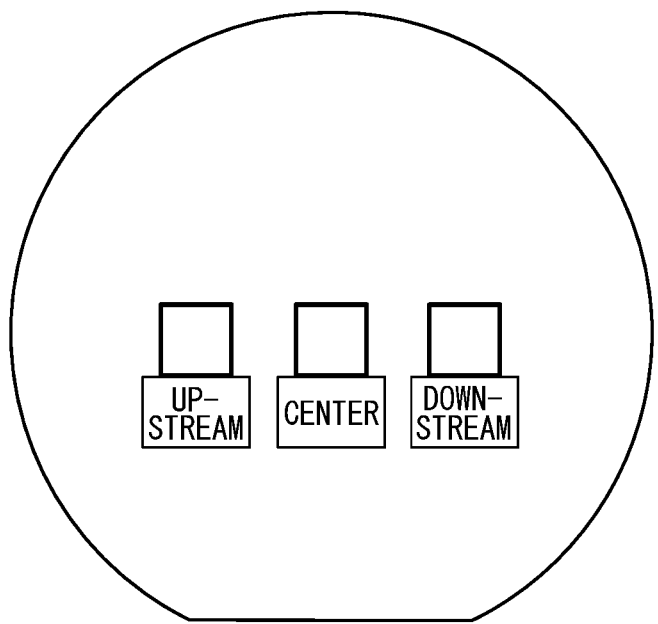
Figure 8D:
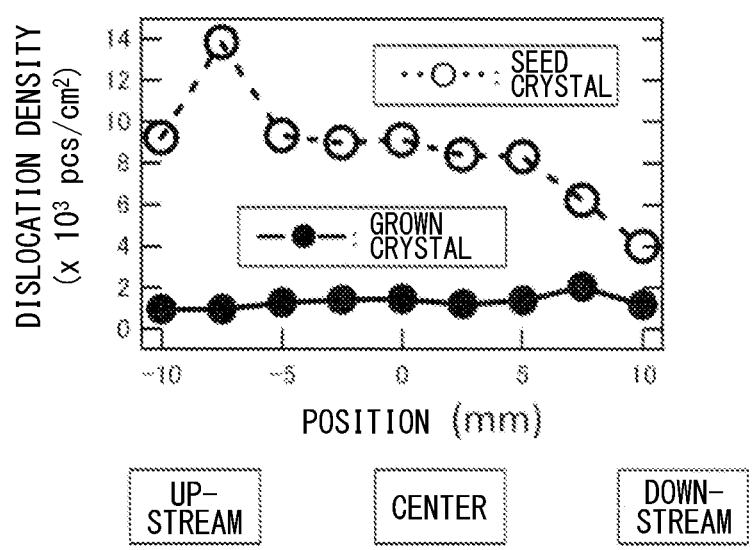

FIG. 8A to FIG. 8D show an example 2. FIG. 8A is a diagram showing an image of the positions of the wafer, that is, the central part, the intermediate part, and the peripheral part of the wafer, and FIG. 8C is a diagram showing an image of the positions of the wafer, that is, an upstream part, an intermediate part, and a downstream part. FIG. 8B and FIG. 8D show the results of examination of dislocation densities in a crystal (at a growth position of 2.5 mm) grown by a gas method and in a seed crystal. The seed crystal is a crystal grown by a sublimation method, which is a general growth method, and it is apparent that the seed crystal has large distribution of the dislocation densities in a crystal plane. On the other hand, in the crystal grown by 2.5 mm by the gas method, it is apparent that the dislocation density is significantly reduced, and that the dislocation density has less variation regardless of the positions in the crystal plane. Accordingly, it is apparent also from the result of this example that the distribution of dislocations is uniform in the crystal grown by the gas method.

The present disclosure can be used in the industrial field of producing silicon carbide single crystals. Although the present disclosure has been described in accordance with the embodiments and the examples, it is understood that the present disclosure is not limited to such embodiments, examples or structures thereof. The present disclosure encompasses various modifications and variations within the scope of equivalents. Furthermore, various combinations and aspects, and other combination and aspect including only one element, more than one element or less than one element, are also within the sprit and scope of the present disclosure.

What is claimed is:

1. A method for manufacturing a silicon carbide single crystal ingot, comprising:
    supplying a raw material gas containing hydrogen gas, monosilane, and hydrocarbon gas to a space in which a seed crystal made of silicon carbide is placed; and
    growing a silicon carbide single crystal on the seed crystal by keeping a monosilane partial pressure at 4 kPa or more and heating the space to a temperature of 2400° C. to 2700° C., wherein
    in the supplying and the growing, the temperature of the space and supply of the raw material gas are controlled such that a temperature gradient of a growth crystal surface of the silicon carbide single crystal in a radial direction is 0.1° C./mm or less, and a radius of curvature of the growth crystal surface is 4.5 m or more, thereby to produce a silicon carbide single crystal ingot having a growth length of 3 mm or more and an internal stress of 10 MPa or less.

2. A method for manufacturing a silicon carbide single crystal wafer, comprising:
    obtaining a silicon carbide single crystal ingot by the method for manufacturing the silicon carbide single crystal ingot according to claim 1; and
    cutting the silicon carbide single crystal ingot obtained into a silicon carbide single crystal wafer.

* * * * *